United States Patent [19]
Yagi et al.

[11] 3,968,511
[45] July 6, 1976

[54] SEMICONDUCTOR DEVICE WITH ADDITIONAL CARRIER INJECTING JUNCTION ADJACENT EMITTER REGION

[75] Inventors: Hajime Yagi, Tokyo; Tadaharu Tsuyuki, Isehara; Kotaro Koma; Yoshihiro Miyazawa, both of Atsugi, all of Japan

[73] Assignee: Sony Corporation, Tokyo, Japan

[22] Filed: Nov. 11, 1974

[21] Appl. No.: 522,773

[30] Foreign Application Priority Data
Nov. 19, 1973 Japan.............................. 48-129924

[52] U.S. Cl.................................... 357/36; 357/20; 357/45
[51] Int. Cl.²....................................... H01L 29/72
[58] Field of Search.................... 357/20, 36, 89, 45

[56] References Cited
UNITED STATES PATENTS
3,444,443   5/1969   Moroshima.......................... 357/36

Primary Examiner—Eli Lieberman
Attorney, Agent, or Firm—Hill, Gross, Simpson, Van Santen, Steadman, Chiara & Simpson

[57] ABSTRACT

A bipolar transistor has an emitter, a base, a collector and additional region which is electrically connected to the base region. The additional region is formed parallel to an emitter-base junction to inject minority carriers into the emitter and has a plurality of windows therein where a plurality of ohmic contacts for the emitter are located.

5 Claims, 11 Drawing Figures

SEMICONDUCTOR DEVICE WITH ADDITIONAL CARRIER INJECTING JUNCTION ADJACENT EMITTER REGION

BACKGROUND OF THE INVENTION

1. Field of the Invention

This invention relates to a semiconductor device, and more particularly to a transistor having an additional carrier injecting junction formed adjacent to an emitter region.

2. Description of the Prior Art

A conventional transistor, which is obtained by a well known double-diffusion method, is to make an emitter region with higher impurity concentration than that of a base region in order to obtain a high amplification factor increasing an emitter efficiency, gamma ($\gamma$).

A grounded-emitter current gain $h_{FE}$, one of the parameters of the transistor characteristics is given by the following equation using a base-grounded amplification factor, alpha ($\alpha$).

$$h_{FE} = \frac{\alpha}{1-\alpha} \qquad (1)$$

The amplification factor, alpha is given as $$\alpha = \alpha^* \cdot \beta \cdot \gamma \qquad (2)$$

where $\alpha^*$ is the collector multiplication ratio, $\beta$ is the base transport factor and $\gamma$ is the emitter efficiency.

In an NPN transistor, the emitter efficiency is given as follows:

$$\gamma = \frac{J_n}{J_n + J_p} = \frac{1}{1 + J_p/J_n} \qquad (3)$$

Where $J_n$ is the current density of electrons injected from the emitter region into the base region, and $J_p$ is the current density of holes injected from the base region into the emitter region. Both current densities are given as follows:

$$J_n = \frac{qD_n N_p}{L_n} \left\{ \exp\left(\frac{qV}{kT}\right) - 1 \right\} \qquad (4)$$

$$J_p = \frac{qD_p N_n}{L_p} \left\{ \exp\left(\frac{qV}{kT}\right) - 1 \right\} \qquad (5)$$

$$\delta = \frac{J_p}{J_n} = \frac{L_n}{L_p} \cdot \frac{D_p}{D_n} \cdot \frac{P_n}{N_p} \qquad (6)$$

Where $L_n$ is the diffusion length of electrons in the base region;

$L_p$ is the diffusion length of holes in the emitter region;

$D_n$ is the electron diffusion constant;

$D_p$ is the hole diffusion constant;

$N_p$ is the minority carrier density in the base region;

$P_n$ is the minority carrier density in the emitter region; and

V is the applied voltage to the emitter-base junction.

The ratio $P_n/N_p$ can be replaced by a ratio $N_A/N_D$ when $N_D$ is the impurity concentration of the emitter region and $N_A$ is the impurity concentration of the base region, The diffusion length $L_n$ in the base region is limited by a base width W. As a result, the ratio $\delta$ is given as follows:

$$\delta = \frac{W}{L_p} \cdot \frac{D_p}{D_n} \cdot \frac{N_A}{N_D} \qquad (7)$$

The diffusion constants are a function of the carrier mobility and the temperature and considered to be fixed.

It is clear that the ratio $\delta$ should be as small as possible in order to obtain a high emitter-grounded amplification factor $h_{FE}$ of the transistor.

In the conventional transistor made by the double-diffusion method, the impurity concentration $N_D$ in the emitter region is made high to reduce the ratio $\delta$. However, the noise characteristics become bad when the impurity concentration in the emitter region is very high, for example, higher than about $10^{19}$ atoms/cm$^3$, because the highly doped region includes lattice defects and dislocations therein, the emitter junction is poor.

SUMMARY OF THE INVENTION

It is an object of the present invention to provide a semiconductor device having improved characteristics.

It is another object of the present invention to provide a bipolar transistor having low noise characteristics.

It is still another object of the present invention to provide a bipolar transistor having a low base sheet resistivity $r_{bb'}$.

FIGS. from 4 to 10 show a fabricating process of the embodiment according to the present invention.

Figure 11:
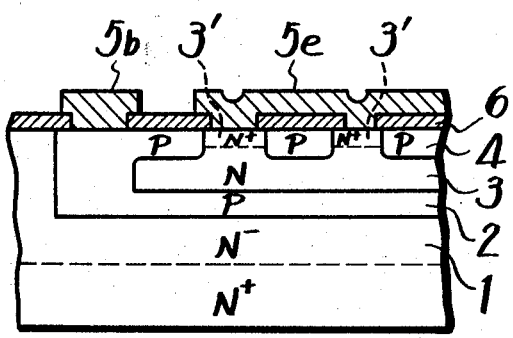

FIG. 11 shows another embodiment of the present invention.

DESCRIPTION OF THE PREFERRED EMBODIMENTS

Figure 1:
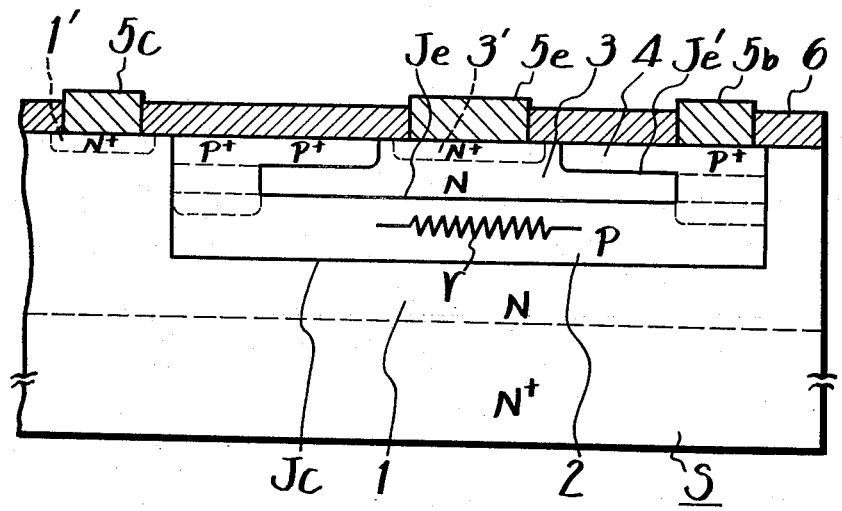
FIG. 1 shows a cross-sectional view of a previously proposed transistor.

Two of the four inventors of the present invention have disclosed in copending application Ser. No. 427,647 to Yagi et al, filed Dec. 26, 1973, now abandoned, a transistor having an emitter region of a low impurity concentration and also having an additional carrier injecting region as shown in FIG. 1.

The example is an NPN transistor, in which a first region 1, a collector region, a second region 2, a base region and a third region 3, an emitter region, are formed in a semiconductor substrate S. Further, a fourth region 4 is formed, which is connected to the second region 2 and is faced to a PN junction $J_e$ formed between the second region 2 and the third region 3. Reference letter $J_c$ is a PN junction formed between the first region 1 and the second region 2. Symbols 5c, 5b and 5e indicate a first, a second and a third electrodes, namely a collector electrode, a base electrode and an emitter electrode, respectively. Reference numeral 6 indicates an insulating layer such as SiO$_2$ (silicon dioxide) formed on a surface of the substrate S.

Impurity concentrations of the second and the third regions 2 and 3 are selected to be about in the order of $10^{15}$ atoms/cm$^3$, which are lower than found in conventional transistors, and are formed as regions having a good lattice structure.

A region 3' is a low sensitivity region of a high impurity concentration formed in the third region 3 at a position where the emitter electrode 5e is formed. A region 1' is a low resistivity region of a high impurity concentration formed in the first region 1 apart from the collector junction $J_c$.

Voltages are applied to each of the electrodes 5e, 5b and 5c, so that the emitter junction $J_e$ is forwardly biased and the collector junction $J_c$ is reversely biased. In this way, the transistor operates with the first, second and third regions 1, 2 and 3, as the collector, base and emitter, respectively. The lifetime of a hole is long because of the low impurity concentration in the emitter region 3 and of good lattice structure. Namely, the diffusion length $L_p$ of a hole in the emitter region 3 is long and it causes the high emitter efficiency $\gamma$ (gamma) according to the equations (6) and (3). But in spite of the large diffusion length $L_p$, if the holes arriving at a surface of the semiconductor body recombine at the surface, the diffusion length $L_p$ can not be substantially large. In the transistor shown in FIG. 1, the fourth region 4 of P-type is located in the N-type emitter 3 facing to and parallel with the emitter junction $J_e$, and it causes the surface recombination to be very small and the diffusion length $L_p$ to be very large. As a result, the emitter efficiency $\gamma$ (gamma) becomes very large.

In addition to the large diffusion length $L_p$, the current density $J_p$ of holes injected from the base region 2 into the emiter region 3 becomes small because of the additional fourth region 4. Namely, the voltage applied to this fourth region 4 of the transistor is the same as the voltage applied to the second region 2 of the base. Because the PN junction $J_e'$ formed between the fourth region 4 and the emitter region 3 is forwardly biased, the hole concentration adjacent the fourth region 4 is increased. In this way, a gradient or a slope of the hole concentration distribution becomes gentle or slow or nearly flat. The diffusion current $J_p$ of holes injected from the base region 2 into the emitter region 3 becomes small. The emitter efficiency $\gamma$ (gamma) becomes high. The ratio of the electron current which reaches the collector to the current component which passes through the emitter junction becomes high. The emitter-grounded amplification factor $h_{FE}$ becomes high.

However, in such a device, the base sheet resistance $r_{bb'}$ is relatively large, especially when an emitter contact electrode 5e is large for the high current transistor, because the distance between the center portion of the emitter junction $J_e$ under the contact 5e and the base electrode 5b is long.

The present invention will be now explained with reference to FIGS. 2 and 3 in which the reference numerals corresponding to those used in FIG. 1 indicate the corresponding elements with each other. A bipolar transistor shown in FIGS. 2 and 3 comprises a silicon substrate S, a first region 1 of N-type collector, a second region 2 of P-type base, a third region 3 of N-type emitter and an additional fourth region 4 of P-type. A collector junction $J_c$ is formed between the collector 1 and the base 2, having an end covered with an insulating layer 6 such as silicon dioxide (SiO$_2$) at a surface of the semiconductor body. An emitter junction $J_e$ is formed between the emitter 3 and the base 2.

The fourth region 4 of the device is located adjacent to the emitter region 3 forming an additional PN junction $J_e'$ therewith. The additional PN junction $J_e'$ faces to the emitter junction $J_e$ and both junctions $J_e$ and $J_e'$ are substantially parallel with each other. A part of the fourth region 4 is connected to the base region 2 at the peripheral portion.

Figure 2:
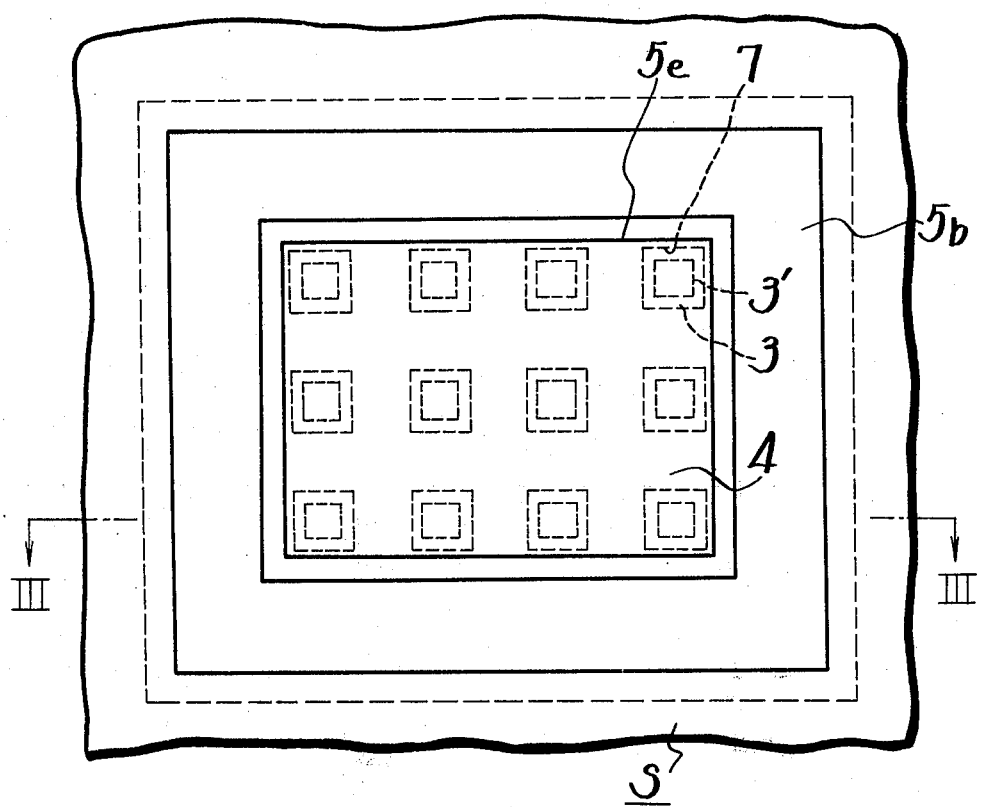

The fourth region 4 has a mesh-like pattern as shown in FIG. 2, having a plurality of openings 7 therein. A part of the third region 3 is located on the surface of the semiconductor body in the openings 7 of the fourth region 4. A plurality of low resistive regions 3' of N-type are formed in the openings 7 of the fourth region 4 connecting to the third region 3 and forming an N$^+$-N junction therewith.

The base electrode 5b is deposited at the peripheral part of the fourth region 4. The remaining part of the fourth region 4 is covered with the insulating layer 6. The emitter electrode 5e is deposited to contact all low resistive regions 3' in the openings 7 and to extend to a part of the insulating layer 6 which covers the third region 3 and N$^+$-N junctions at the surface of the semiconductor body.

Figure 3:
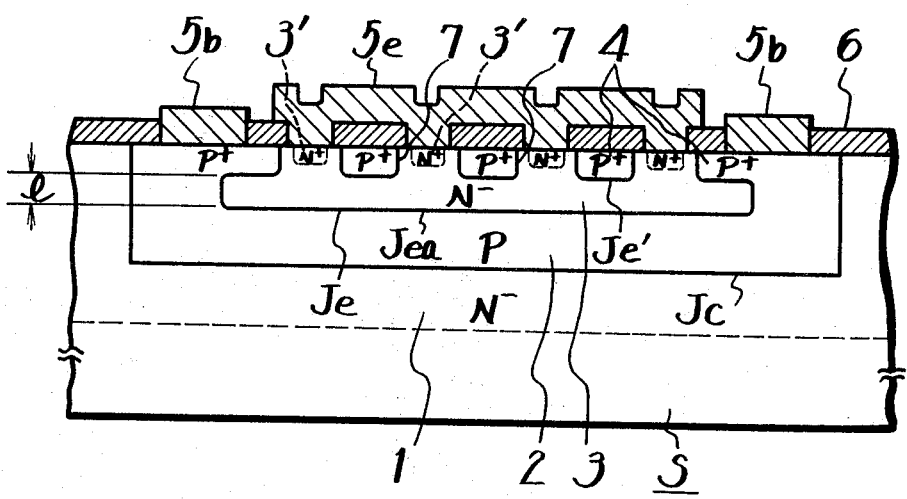
FIGS. 2 and 3 show a plane view and a cross sectional view of an embodiment according to the present invention.

FIG. 3 shows a cross-sectional view of the device along the dotted line III—III in FIG. 2.

A distance between the second region 2 and the fourth region 4 is indicated $l$ and it is selected smaller than the diffusion length $L_p$ of carriers injected from the second region 2 into the third region 3. In other words, the distance $l$ between the emitter junction $J_e$ and the additional PN junction $J_e'$ is selected smaller than the diffusion length $L_p$ of the minority carrier in the emitter region 3.

In the transistor of the present invention, the additional PN junction $J_e'$ between the third and fourth regions 3 and 4 is forwardly biased, when the emitter junction $J_e$ between the second and third regions 2 and 3 is forwardly biased. In this way, the impedance between the second region 2 and the fourth region 4 is very low because the distance $l$ is selected smaller than the diffusion length $L_p$.

As a result, the base sheet resistance $r_{bb'}$ of the transistor becomes very small, for example, it is a half of the base sheet resistance $r_{bb'}$ of the device shown in FIG. 1, keeping the low noise characteristics.

Figure 4:
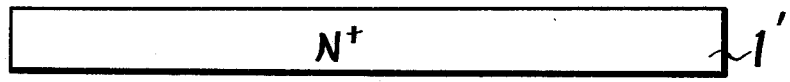

The fabrication process of the device will be now described with reference to FIGS. 4 to 10. First, as shown in FIG. 4, a silicon (Si) substrate 1' of N-type is prepared, which has a resistivity of 0.008 to 0.012 $\Omega$.cm. The thickness of the substrate 1' is about 200 $\mu$.

Figure 5:
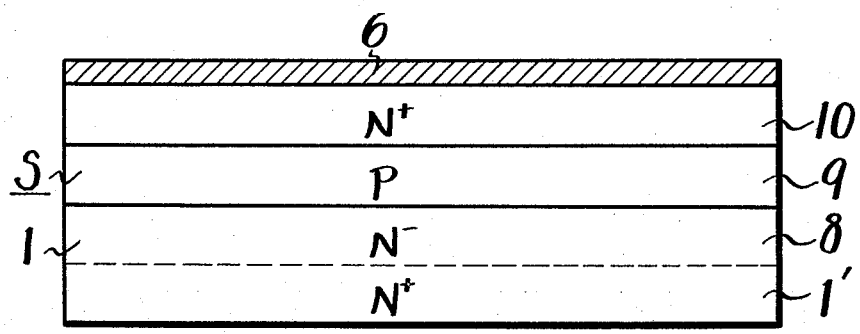

As shown in FIG. 5, first semiconductor layer 8 of N-type silicon having the same conductivity type as the substrate, is grown by the epitaxial technique on one surface of the substrate 1. The first layer 8 has a relatively low impurity concentration and a high resistivity, for example, 2 $\Omega$.cm. The thickness of the layer 8 is selected about 10 $\mu$. Continuously, a second semiconductor layer 9 of P-type silicon which forms mainly the second region 2, is epitaxially grown on the surface of the first semiconductor layer 8. A resistivity of the second layer 9 is selected about .3 $\mu$.cm and its thickness is about 3 to 4 $\mu$. A third semiconductor layer 10 of N-type silicon is also epitaxially grown on the surface of the second semiconductor layer 9. A resistivity of the third layer 10 is relatively high, for example 2 $\Omega$.cm and the thickness of the third layer 10 is selected to about 5 to 7 $\mu$. These three semiconductor layers 8, 9 and 10 may be continuously grown in the same epitaxial furnace and form a semiconductor body or substrate S together with the low resistivity substrate 1'. Further, an insulating layer 6 for the diffusion mask is formed on the surface of the silicon substrate S or the layer 10 by the well known technique. For example, the insulating layer 6 is a thermally grown silicon dioxide ($SiO_2$) layer oxidized in the atmosphere with oxygen at 1130°C for 30 minutes.

Figure 6:
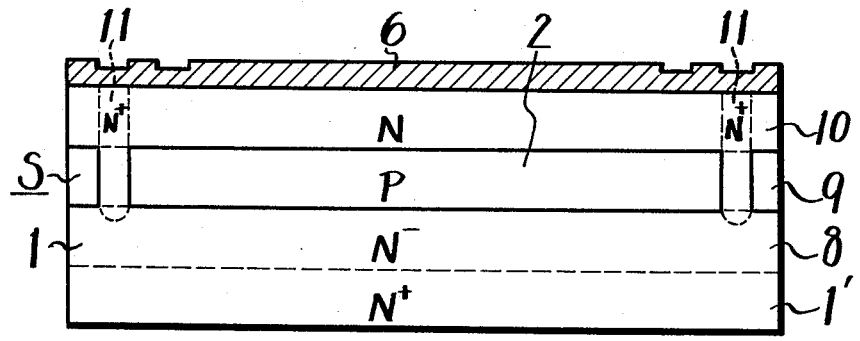
Figure 7:
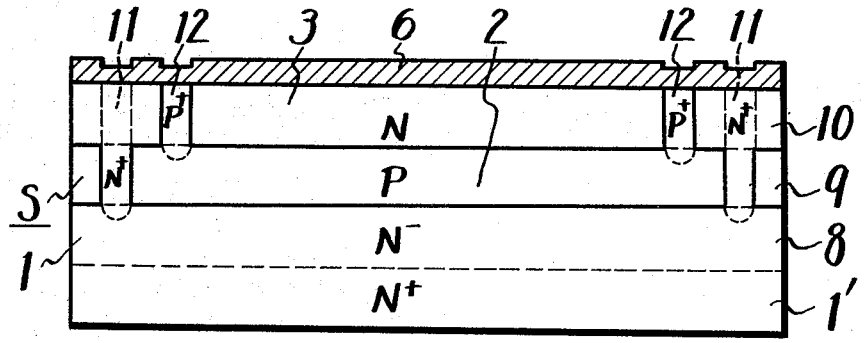

A ring-shaped window is opened in the insulating layer 6 by the photo-etching process. A diffused region 11 of N-type is formed by the diffusion through the ring-shaped window of the insulating layer 6 extending from the surface of the layer 10 to the first layer 1 of the layer 8 crossing the third and the second layers 10 and 9. It surrounds and forms the second region 2 to be the base region of the transistor as shown in FIG. 6. The diffusion process at 1240°C for 100 minutes forms the diffused region 11 of N-type with a sheet resistance of about 10Ω/square.

Another ring-shaped window is opened in the insulating layer 6 within the area of the diffused region 11. A diffused region 12 of P-type is formed by the diffusion through the inner window in the insulating layer 6 extending from the surface of the layer 10 to the second layer 9 crossing the third layer 10. It surrounds and forms the third region 3 as the emitter region having the low impurity concentration. The diffusion process at 1240°C for 50 minutes forms the diffused region 12 of P-type with a sheet resistance about 6Ω/square.

Figure 8:
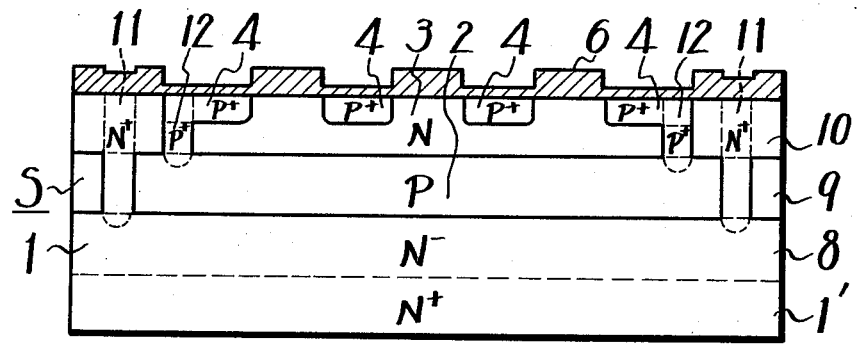

A diffusion window is further opened in the insulating layer 6 where the fourth region 4 is to be formed in mesh-like pattern covering the diffused region 12 of P-type. The mesh-like or grid-like fourth region 4 of P-type is formed as shown in FIG. 8 by a diffusion through the window opened in the insulating layer 6, which is connected to the second region 2 through the diffused P-type region 12. The fourth region 4 is formed shallower than the thickness of the third region 3, surrounding a plurality of windows therein where the third region 3 is located. It is formed by the diffusion at 1100°C in atmosphere for 100 minutes so that it has a sheet resistance of about 180Ω/square.

Figure 9:
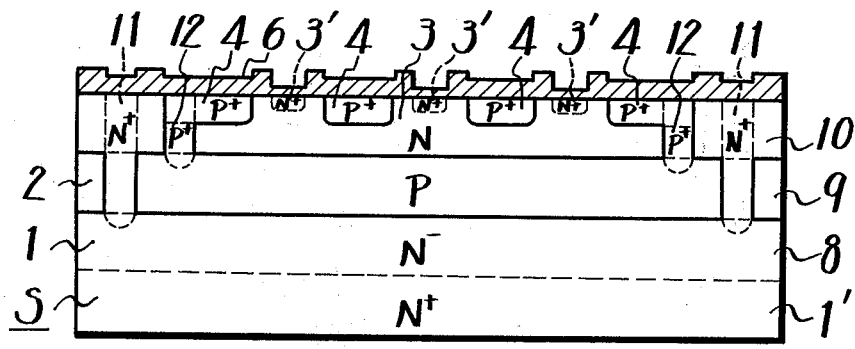

A plurality of windows are opened in the insulating layer 6 covering the third N-type region 3 at the position facing to the thid region 3. The N-type regions 3' of N-type with high impurity concentration are diffused through these windows of the insulating layer 6 as shown in FIG. 9. The highly doped regions 3' are formed by the diffusion at 1000°C in atmosphere for 35 minutes forming a $N^+$-N junction with the third region 3 of N-type. The sheet resistance of the highly doped regions 3' is about 10Ω/square.

Figure 10:
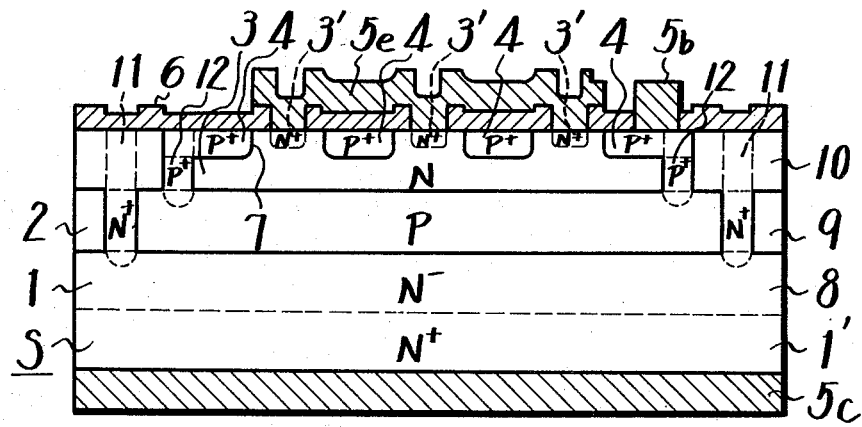

A plurality of windows for ohmic contacts are opened in the insulating layer 6. An emitter electrode 5e and a base electrode 5b are deposited so that the emitter electrode 5e contacts with all of heavily doped regions 3' and the base electrode 5b contacts with the diffused region 12. A collector electrode 5c is deposited on the bottom surface of the semi-conductor body contacting with the low resistivity region 1' of N-type as shown in FIG. 10.

The second region 2, the base, is formed by the epitaxial growth in the above embodiment, but the selective diffusion or the ion-implantation methods may be applied to the invention.

The fourth region 4 is connected to the second region 2, the base, through the diffused region 12 of the same conductivity type, but both regions may be electrically connected by another way, for example, by a metal connection.

FIG. 11 shows another embodiment of the present invention, in which the heavily doped regions 3' of N-type are diffused through the entire area of windows of the fourth region 4. This embodiment would be available when the pattern of the semiconductor device is very fine, for example, when the transistor of the invention is applied to an LSI (large scale integrated circuit).

The invention is also applicable to a PNP transistor and a thyristor.

It will be apparent that many modifications and variations could be effected by those skilled in the art without departing from the spirit or scope of the novel concepts of the present invention.

We claim as our invention:

1. A semiconductor device comprising:
   a. a first region of a first conductivity type;
   b. a second region of a second conductivity type interfaced with said first region;
   c. a third region of said first conductivity type and predetermined impurity concentration interfaced with said second region and remote from said first region;
   d. a fourth region of said second conductivity type remote from said second region and interfaced with said third region to form an additional junction therewith and having a plurality of windows therein;
   e. a distance between said fourth region and said second region being selected shorter than the diffusion length of minority carriers in said third region injected from said second region; and
   f. a plurality of ohmic contact portions formed in said windows of said fourth region.

2. A semiconductor device as claimed in claim 1, in which said fourth region is connected to said second region through a semiconductor region of said second conductivity type.

3. A semiconductor device comprising:
   a. a collector region of a first conductivity type;
   b. a base region of a second conductivity type interfaced with said collector region to form a collector P-N junction;
   c. an emitter region of said first conductivity type and low predetermined impurity concentration interfaced with said base region to form a base-emitter P-N junction spaced from said collector P-N junction by said base region;
   d. a carrier injection region of said second conductivity type interfaced with said emitter region to form an additional P-N junction spaced from said base-emitter P-N junction by portions of said emitter region therebetween having a thickness smaller than the diffusion length of minority carriers in said emitter region injected from said base region when said emitter P-N junction is forward biased, said carrier injection region having a plurality of windows therein;
   e. an ohmic contact region of first conductivity type and high predetermined impurity concentration formed in each of said windows;
   f. collector and base electrodes respectively connected to said collector region and base region; and
   g. an emitter electrode connected to and interconnecting each of said ohmic contact regions.

4. A semiconductor device of claim 3, in which said carrier injection region is connected to said base region through a semiconductor region of a second conductivity type.

5. A semiconductor device of claim 3, in which said emitter region has a thickness of about 5 to 7 microns.

* * * * *